(12) United States Patent
Purdila et al.

(10) Patent No.: US 10,924,066 B2
(45) Date of Patent: Feb. 16, 2021

(54) OFFSET VOLTAGE TRIMMING FOR OPERATIONAL AMPLIFIERS

(71) Applicant: SEMICONDUCTOR COMPONENTS INDUSTRIES, LLC, Phoenix, AZ (US)

(72) Inventors: Anca Purdila, Bucharest (RO); Constantin Pasoi, Piatra Neamt (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 25 days.

(21) Appl. No.: 16/530,192

(22) Filed: Aug. 2, 2019

(65) Prior Publication Data

US 2020/0119698 A1    Apr. 16, 2020

Related U.S. Application Data

(60) Provisional application No. 62/744,449, filed on Oct. 11, 2018.

(51) Int. Cl.
*H03F 3/45*    (2006.01)
*H03F 1/30*    (2006.01)

(52) U.S. Cl.
CPC ......... *H03F 1/301* (2013.01); *H03F 3/45179* (2013.01); *H03F 2200/375* (2013.01); *H03F 2200/447* (2013.01); *H03F 2203/45542* (2013.01)

(58) Field of Classification Search
CPC ....................................................... H03F 3/45
USPC .................................................. 330/253, 261
See application file for complete search history.

(56) References Cited

U.S. PATENT DOCUMENTS

| 6,614,302 | B2 * | 9/2003 | Abe ................... H03F 3/45219 330/253 |
| 6,696,894 | B1 | 2/2004 | Huang |
| 7,170,347 | B1 | 1/2007 | Kindt |

\* cited by examiner

*Primary Examiner* — Henry Choe
(74) *Attorney, Agent, or Firm* — Brake Hughes Bellermann LLP

(57) ABSTRACT

An operational amplifier is disclosed. The operational amplifier activates/couples either a first or a second differential pair of transistors to an input based on the input voltage. The first and second pair of transistors are each biased with a current having a first portion that is constant with temperature and a second portion that is proportional to temperature. By adjusting the ratios of the first and second portions, the transconductance of each differential pair may be made relatively constant with temperature. Each differential pair is coupled to a trim current source that is adjusted to reduce the voltage offset at each output. The resulting voltage offset for the operational amplifier is relatively constant over a range of input voltages and has temperature coefficient unaffected by the trimming process.

19 Claims, 9 Drawing Sheets

OFFSET VOLTAGE TRIMMING FOR OPERATIONAL AMPLIFIERS

CROSS-REFERENCE TO RELATED APPLICATION

This application claims the benefit of U.S. Provisional Application No. 62/744,449, filed on Oct. 11, 2018, which is hereby incorporated by reference in its entirety.

FIELD OF THE DISCLOSURE

The present disclosure relates to offset voltage ($V_{OS}$) correction (i.e., trimming) for an operational amplifier and, more specifically, to a circuit and method that provides a trimmed offset voltage that has a variation with temperature (i.e., temperature coefficient) that is unchanged by the process of trimming.

BACKGROUND

An operational amplifier including a metal oxide semiconductor (i.e., MOS) transistor differential input stage may have an offset voltage (i.e., voltage offset, $V_{OS}$) in a range comparable to millivolt (i.e., mV). High performance applications, however, may require a $V_{OS}$ that is comparable to a microvolt (i.e., µV) and that has a low $V_{OS}$ temperature coefficient (i.e., $T_C$). Adjusting the circuit in the factory to reduce $V_{OS}$ (i.e., trimming) is a suitable way to meet these requirements.

In some operational amplifiers (e.g., rail-to-rail), complementary input pairs of transistors may be used for different input voltages. For example, a first input differential pair of transistors (e.g., p-type) may be coupled to the input for a range of relatively low voltages, while a second input differential pair of transistors (e.g., n-type) may be coupled to the input for a range of relatively high voltages.

SUMMARY

Accordingly, in one aspect, the present disclosure generally describes an operational amplifier. The operational amplifier includes a first differential pair of pMOS transistors that are biased by a first bias current (Ibias_p). The first bias current includes a first portion (Ict_p) that is constant with temperature and a second portion (Iptat_p) that is proportional to temperature. The ratio of the first and second portions generates a first transconductance ($g_m$) of the first differential pair (pMOS pair) that is substantially constant for temperatures over a range. The operational amplifier also includes a second differential pair of nMOS transistors that are biased by a second bias current (Ibias_n). The second bias current includes a first portion (Ict_n) that is constant with temperature and a second portion (Iptat_n) that is proportional to temperature. The ratio of the first and second portions provides a second transconductance ($g_m$) of the second differential pair that is substantially constant for temperatures over the range. The operational amplifier further includes comparators that activate either the first differential pair or the second differential pair based on an input voltage (i.e., input common mode voltage, $V_{CM}$). The input of the operational amplifier is coupled to the activated differential pair of transistors.

The operational amplifier can further include a first trimming circuit that includes a first current source to generate a first trim current. The first trimming circuit can be configured (e.g., by adjusting/switching the first current source) to trim the first bias current through one of the pMOS transistors in the first differential pair (of pMOS transistors). The trimming corrects (i.e. adjusts towards zero volts) a first voltage offset ($V_{OS}$) of the first differential pair. Additionally, the operational amplifier can further include a second trimming circuit that includes a second current source to generate a second trim current. The second trimming circuit can be configured (e.g., by adjusting/switching the second current source) to trim the second bias current through one of the nMOS transistors in the second differential pair (of nMOS transistors). The trimming corrects (i.e. adjusts towards zero volts) a second voltage offset ($V_{OS}$) of the second differential pair.

In some embodiments, the first trim current may be constant with temperature to provide a first voltage offset that has a first temperature coefficient that is substantially the same before and after the trimming. Additionally, the second trim current may be constant with temperature to provide a second voltage offset that has a second temperature coefficient that is substantially the same before and after the trimming.

In another aspect the present disclosure generally describes a method for reducing an offset voltage in an operational amplifier. The method includes applying a first bias current to a first differential pair of transistors. The first bias current includes a first portion that is constant with temperature and a second portion that is proportional to absolute temperature, and a ratio of the first and the second portions is selected so that a first transconductance of the first differential pair is substantially constant for temperatures over a range. The method further includes generating a first trim current to trim the first bias current through one of the transistors in the first differential pair to reduce a first voltage offset of the first differential pair of transistors towards zero volts. The method also includes applying a second bias current to a second differential pair of transistors. The second bias current includes a first portion that is constant with temperature and a second portion that is proportional to absolute temperature, and a ratio of the first and the second portions is selected so that a second transconductance of the second differential pair is substantially constant for temperatures over the range. The method further includes generating a second trim current to trim the second bias current through one of the transistors in the second differential pair to reduce a second voltage offset of the second differential pair of transistors towards zero volts.

In another aspect the present disclosure generally describes a rail-to-rail operational amplifier. The rail-to-rail operational amplifier includes a first differential pair of p-type transistor configured to be biased by a first bias current (i.e., activated by a first bias current). The rail-to-rail operational amplifier also includes a first trimming circuit that is coupled to the first differential pair of p-type transistors and that is configured to trim the first bias current through one of the p-type transistors in the pair of p-type transistors to adjust a first offset voltage towards zero volts. The rail-to-rail operational amplifier also includes a second differential pair of n-type transistors configured to be biased by a second bias current (i.e., activated by a second bias current). The rail-to-rail operational amplifier also includes a second trimming circuit that is coupled to the second differential pair of n-type transistors and that is configured to trim the second bias current through one of the n-type transistors in the pair of n-type transistors to adjust a second offset voltage towards zero volts.

The foregoing illustrative summary, as well as other exemplary objectives and/or advantages of the disclosure, and the manner in which the same are accomplished, are further explained within the following detailed description and its accompanying drawings.

DETAILED DESCRIPTION

Figure 1:
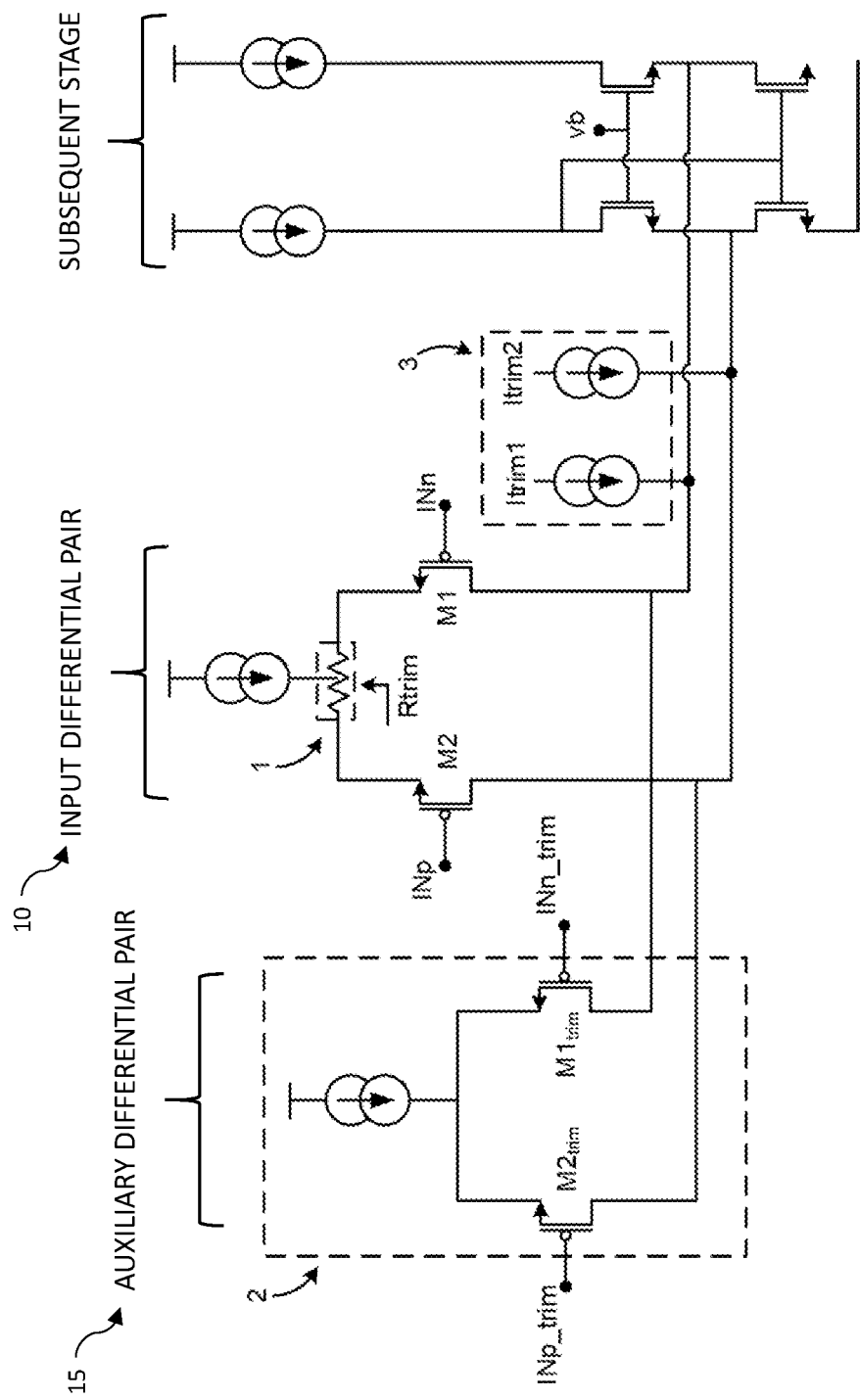
FIG. 1 schematically depicts a portion of an operational amplifier and three possible approaches for reducing a voltage offset.

The present disclosure describes an operational amplifier having two input stages. An input of the operational amplifier may be coupled to either of the two input stages. The particular input stage that the input is coupled to may be determined based on a comparison of a common-mode input voltage ($V_{CM}$) to a threshold (i.e., reference) voltage ($V_{REF}$). Each input stage includes a pair of transistors arranged as a differential pair (i.e., differential amplifier).

The first differential pair may include two p-type (i.e., p-channel) metal oxide semiconductor field effect transistors (i.e., pMOS) and may be coupled to the input for a range of relatively low voltages (e.g., $V_{CM}<V_{REF}$). The second differential pair may include two n-type (i.e., n-channel) metal oxide semiconductor field effect transistors (i.e., nMOS) and may be coupled to the input for a range of relatively high voltages (e.g., $V_{CM}>V_{REF}$). Each differential pair is biased by a biasing current at the source terminals of the transistors, which are coupled together. When coupled to the input, the two gate terminals of the selected differential pair are attached to the differential input terminals (IN+, IN−) of the operational amplifier. The (differential) output of the differential pair is at the drain terminals of the differential pair.

The two transistors in each differential pair are ideally identical in all aspects of their operation. In practice, small differences exist (e.g., due to manufacturing process variation), resulting in an input offset voltage ($V_{OS}$). The $V_{OS}$ may be thought of as the voltage applied at the input to have zero voltage at the output. A $V_{OS}$ may be in the millivolt (mV) range for routine applications, but high performance applications may require $V_{OS}$ to be in the microvolt (µV) range.

Reducing the $V_{OS}$ of an operational amplifier (i.e., opamp) to a voltage in the µV range may be accomplished by adjusting (i.e., trimming) the current through one of the transistors of the differential pair to compensate for the small differences. The trimming may be performed at the time of fabrication (i.e., factory adjusted). For example, each differential pair may be trimmed for a particular input voltage ($V_{CM}$) and for a particular temperature (e.g., at 25 degrees Celsius (C)). Because the operation of each transistor in each differential pair varies with temperature, the $V_{OS}$ for each differential pair will have some variation with temperature. This variation is known as the temperature coefficient of the $V_{OS}$. It is desirable that the trimming does not affect (e.g., change) the temperature coefficient ($T_C$) of the $V_{OS}$. Additionally, because the operational amplifier may accommodate a range of input voltages ($V_{CM}$) over which the differential pair changes (i.e., the input pairs function consecutively with respect to $V_{CM}$), a $V_{OS}$ with a small overall variation (e.g., around zero volts) with $V_{CM}$ at a particular temperature (e.g., 25 deg. C.) is desirable.

Trimming an input differential pair of an opamp may be accomplished in different ways. Three approaches are illustrated in FIG. 1. In the first approach 1, a trim resistor (Rtrim) is used to adjust the bias of the input differential pair of transistors 10 (M1, M2). This approach is lossy and the trim resistor could add noise and variation with temperature. In the second approach 2, an auxiliary differential pair 15 (M1$_{trim}$, M2$_{trim}$) is added to introduce an offset voltage that cancels the $V_{OS}$ of the input differential pair. This approach suffers from complexity and variation. In the third approach 3, the bias current through each transistor (M1, M2) is controlled by a current source (Itrim1, Itrim2). $V_{OS}$ may be adjusted by adjusting the current difference between the current sources (Itrim1, Itrim2). The present disclosure describes circuits and methods based on the third approach 3.

The disclosure describes circuits and methods to reduce the $V_{OS}$ of an operational amplifier. Additionally, the circuits and methods disclosed accommodate the need to independently adjust the $V_{OS}$ for two input differential pairs (i.e. pMOS and nMOS) that are usually used in rail-to-rail input operational amplifiers.

Figure 2:
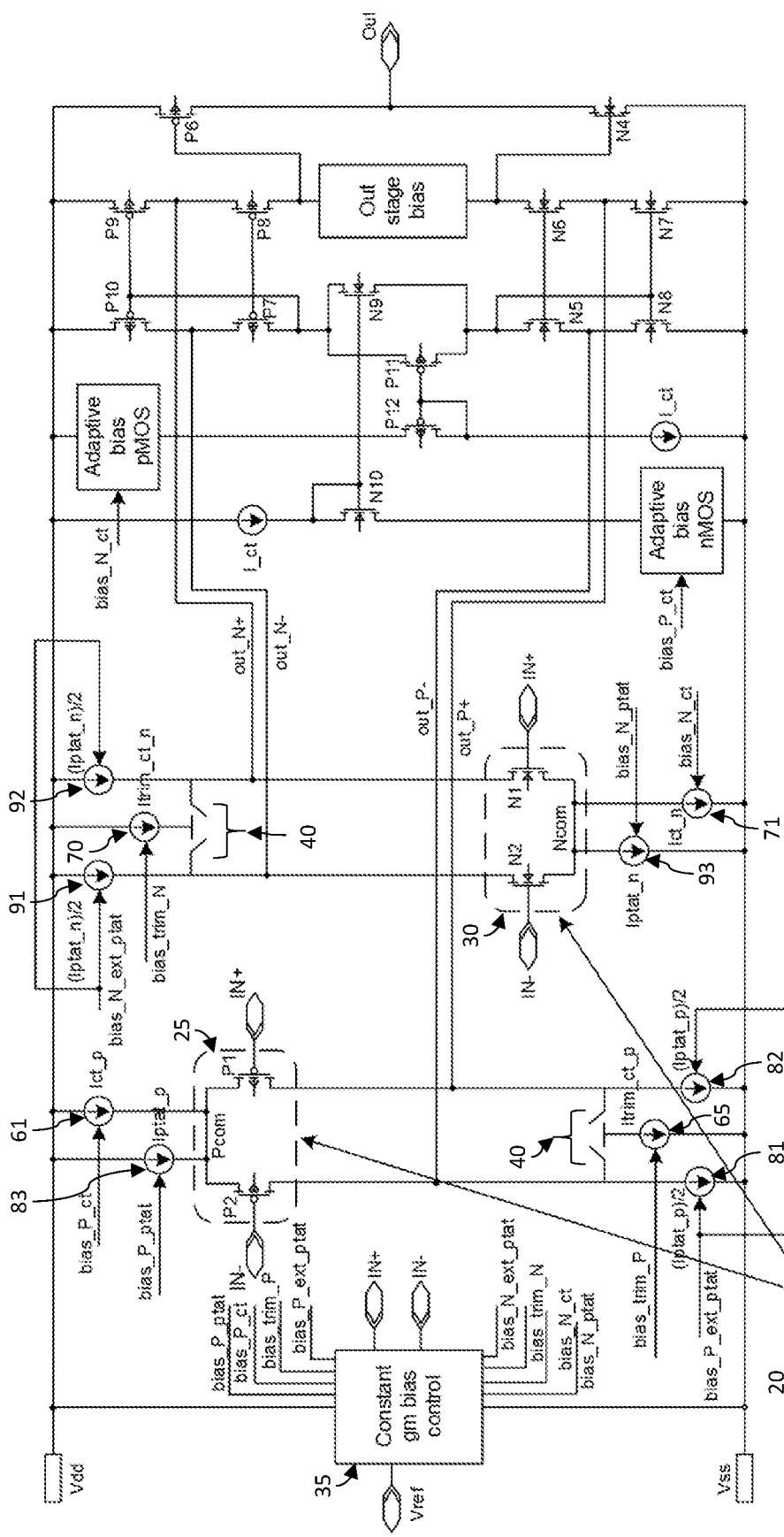
FIG. 2 schematically depicts an operational amplifier according to an embodiment of the present disclosure.

FIG. 2 schematically depicts a rail-to-rail operational amplifier according to an embodiment of the present disclosure. To cover the entire input voltage ($V_{CM}$) range, complementary input differential pairs 20 are included. The first input pair 25 includes pMOS transistors and is used for relatively low $V_{CM}$. The second input pair 30 includes nMOS devices and is used for relatively high $V_{CM}$. In some embodiments, a midrange of $V_{CM}$ that is between a relatively low range of $V_{CM}$ and a relatively high range of $V_{CM}$ is defined. In the midrange of $V_{CM}$, either the first input pair or the second input pair may be used. The first input pair 25 and the second input pair 30 each have a $V_{OS}$ that is different and uncorrelated from the other.

Figure 6:
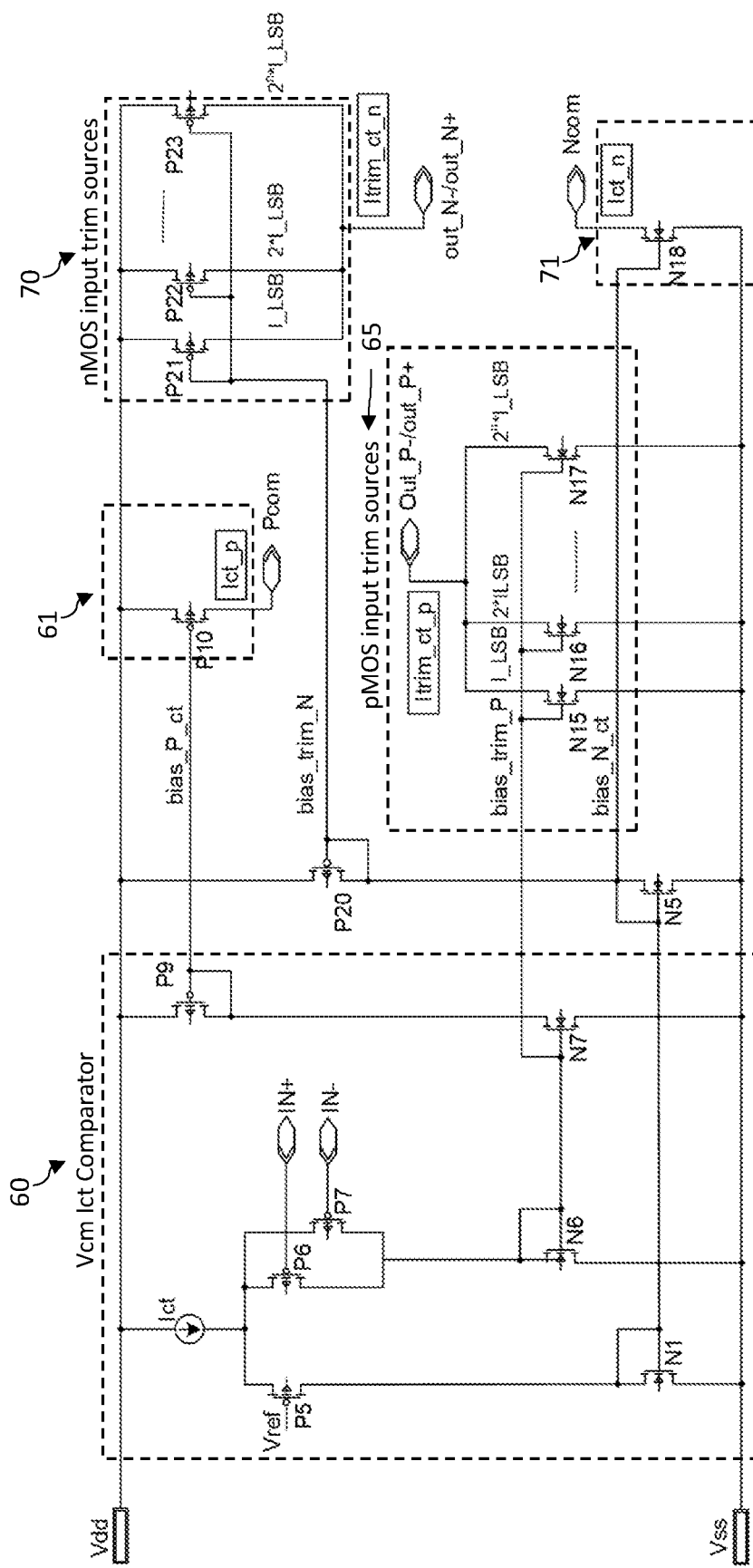
FIG. 6 schematically depicts details of circuit portions for input pair and trimming sources activation and for bias control for constant (ct) current sources of the operational amplifier shown in FIG. 2.
Figure 7:
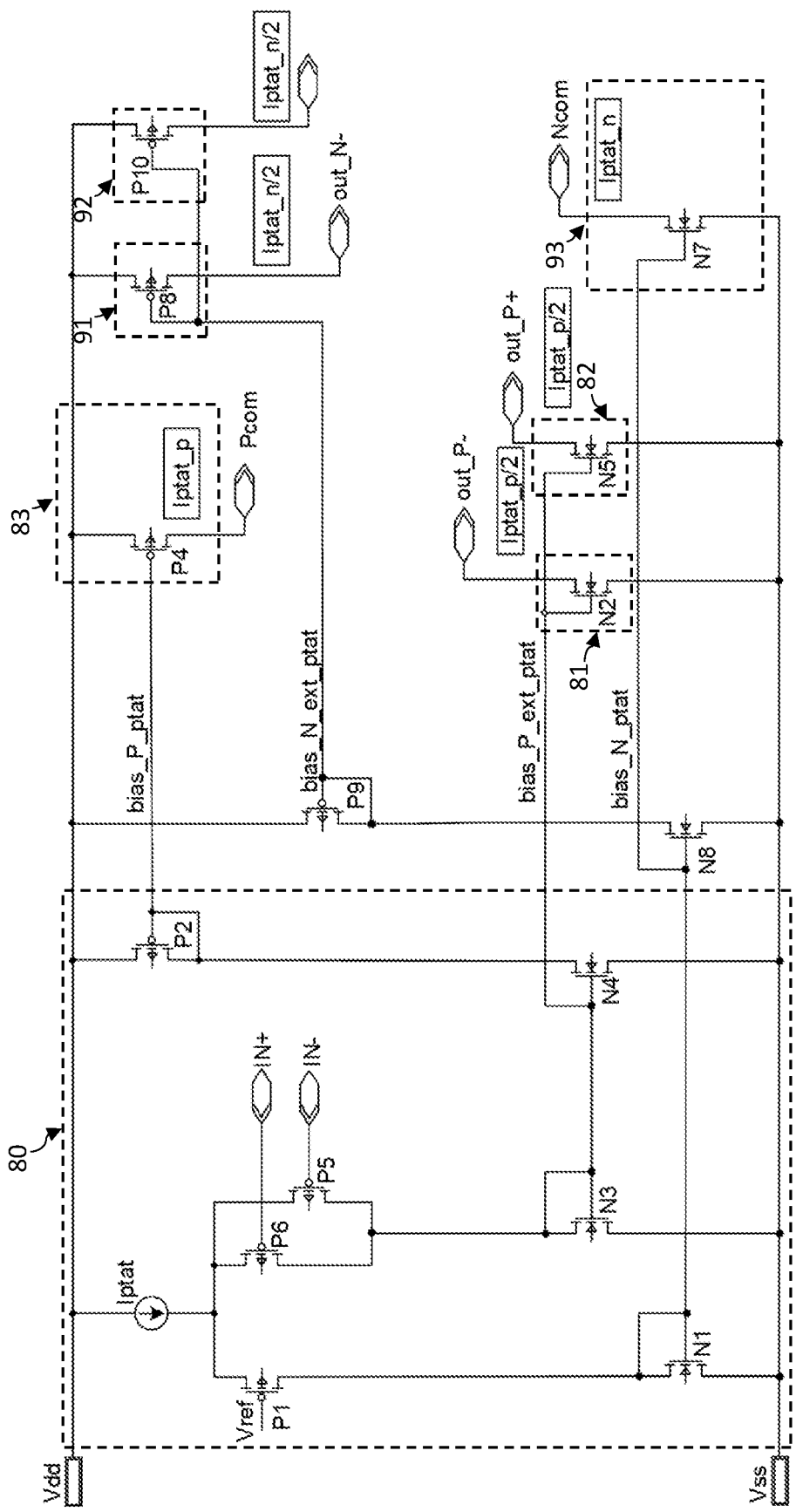
FIG. 7 schematically depicts details of circuit portions for input pair activation and bias control for PTAT current sources of the operational amplifier shown in FIG. 2.

To provide a substantially constant gain and bandwidth over a range of $V_{CM}$, the complementary input pairs 20 can be biased (i.e., turned ON) to function one at a time based on $V_{CM}$. The reason for the input pair selection is to keep the transconductance (gm) of the first gain stage (i.e., the first input pair or the second input pair) of the operational amplifier as constant as possible over the entire $V_{CM}$ range. The transition between the first input pair 25 and the second input pair 30 can occur at an input voltage within (e.g., at approximately the middle of) the $V_{CM}$ range where either the first or the second pair functions properly. The transition for each pair can be accomplished by using a $V_{CM}$ comparator that compares the input voltage, $V_{CM}$, to a reference voltage, $V_{REF}$. Accordingly, the constant gm bias control block (i.e., circuit) 35 may include one or more $V_{CM}$ comparators. For example, the constant gm bias control circuit 35 may include a first circuit portion having a first comparator 60 corresponding to the constant with temperature portion of the bias current of the input pairs 20 (i.e., Ict_p 61 and Ict_n 71). Details of a possible implementation of the first circuit portion are shown in FIG. 6. Likewise, the constant gm bias control circuit 35 may include a second circuit portion having a second comparator 80 corresponding to the proportional to absolute temperature portion of the bias currents of the input pairs 20 (i.e., Iptat_p 83 and Iptat_n 93). Details of a possible implementation of the second circuit portion are shown in FIG. 7. Comparators 60 and 80 have identical inputs (i.e., $V_{REF}$ on one side and $V_{CM}$ on the other) and function in tandem, keeping a constant ratio between PTAT (i.e., ptat) and CT (i.e., ct) portions of the bias currents for the input pairs 20 over the entire input voltage ($V_{CM}$) range.

As shown in FIG. 2, each complementary input pair is biased with a combination of two currents: one current is proportional to absolute temperature (i.e. ptat) and one current is constant with temperature (i.e., ct). For example, the first input pair 25 is biased by a ptat current, Iptat_p, determined by the bias P_ptat voltage and by a constant CT current, Ict_p, determined by the bias_P_ct voltage. The second input pair 30 is biased by a ptat current, Iptat_n, determined by the bias_N_ptat voltage and by a constant (CT) current, Ict_n, determined by the bias_N_ct voltage.

In order to provide a good noise performance and to keep the bias of subsequent amplifier stages constant with temperature, the PTAT currents are subtracted from the signal paths (i.e., out_P−, out_P+ and out_N−, out_N+) through a first current source 81 and a second current source 82 (having current determined by a bias_P_ext_ptat voltage) for the first input pair 25 and through a third current source 91 and a fourth current source 92 (having current determined by bias_N_ext_ptat voltage) for the second input pair 30. In other words, only the complementary input pairs of the operational amplifier are biased with a combination of constant currents and PTAT currents. All subsequent stages are biased with constant currents only (e.g., the PTAT currents are subtracted from the signal paths to subsequent sections). In this way, the total current of the operational amplifier can have a minimum variation with temperature and the total current consumption can be kept to a minimum.

To reduce VOS, each pair can be trimmed with a trim current from a current source. As shown in FIG. 2, the trim current for the first input pair 25 is Itrim_ct_p and the trim current for the second input pair 30 is Itrim_ct_n. The trim current for each input pair is constant (i.e., ct) with temperature and can be added to either side (i.e., each transistor) of the input pair to account for both positive and negative offsets. The selection of which side to add the current to may be accomplished using switching devices (i.e., switches) 40.

One aspect of the circuits and methods disclosed is that a $T_C$ of a $V_{OS}$ after trimming (i.e., $T_{c\_trim}$) is the same as before trimming (i.e., $T_c$). For one possible embodiment, this can be accomplished as follows. First, each input pair is designed to operate in a subthreshold region. Second, each input pair is biased using a bias current ($I_{BIAS}$) that is a weighted sum of a PTAT (i.e., temperature dependent) current and a CT (i.e. temperature independent) current to make the transconductance ($g_m$) for each input pair constant over temperature. When these conditions are met, the input pair may be trimmed using a current source ($I_{TRIM}$) that is constant over temperature to obtain a $V_{TRIM}$ that is constant over temperature and that does not affect the $T_C$ of $V_{OS}$. In other words, the $T_C$ for the $V_{OS}$ of each pair is unaffected by the trimming to reduce the $V_{OS}$. This is summarized mathematically in the equations below:

$$V_{TRIM} = \frac{I_{TRIM}}{g_m} \quad (I_{TRIM} \text{ is constant with temperature}), \tag{1}$$

$$g_m = \frac{I_{BIAS}}{n \cdot V_T} = \frac{\frac{(V_T \cdot \ln(z))}{R}}{n \cdot V_T} = \frac{\ln(z)}{n \cdot R} \quad (g_m \text{ is constant with temperature}), \tag{2}$$

$$V_{TRIM} = \frac{I_{TRIM} \cdot n \cdot R}{\ln(z)} \quad (V_{TRIM} \text{ is constant with temperature}). \tag{3}$$

In one possible embodiment, $I_{BIAS}$ (i.e., from equation (2)) may be derived from a bandgap-like structure that includes two bipolar transistors and that has an output current equal to $\Delta V_{BE}/R$, which can be written as $(V_T \cdot \ln(z))/R$, where z is a multiplication factor between the areas of the emitters of the two bipolar transistors in the bandgap structure. In other words, the careful control of $I_{BIAS}$ allows for the temperature dependent variable (i.e., the thermal voltage, $V_T$) to be canceled out of the equation for transconductance ($g_m$), and what remains is independent of temperature. Thus, because $g_m$ is constant with temperature, $V_{TRIM}$ can be made constant with temperature by trimming using a current ($I_{TRIM}$) that is constant with temperature.

Trimming can include making the initial $V_{OS}$ offset temperature drift (i.e., temperature coefficient ($T_C$)) as small as possible by biasing an input pair in a weak inversion operating region (i.e. subthreshold region). The trimming further includes using a bias current that is predominantly PTAT to make the transconductance of input pair constant with temperature. Then, the $V_{OS}$ can be adjusted using a trim current that is constant with temperature to obtain a trimmed $V_{OS}$ that has a thermal coefficient that is relatively unchanged from its initial (i.e., untrimmed) value. For example, the first input pair 25 may be biased using a predominantly PTAT sum current (i.e., Iptat_p+Ict_p) and trimmed with a constant trim current, Itrim_ct_p. The bias current may be divided in equal parts (i.e., (Iptat_p)/2+ (Ict_p)/2) for each transistor in the pair. Further, the current Iptat_p/2 is subtracted from the signal path and Ict_p/2 is passed on to the next amplifier stage. Similarly, the second pair 30 may be biased using a predominantly PTAT sum current (i.e. Iptat_n+Ict_n) and trimmed with a constant trim current, Itrim_ct_n. The bias current may be divided in equal parts (i.e., (Iptat_n)/2+(Ict_n)/2) for each transistor in the pair. Further, the current Iptat_n/2 is subtracted from the signal path and Ict_n/2 is passed on to the next amplifier stage.

Figure 3:
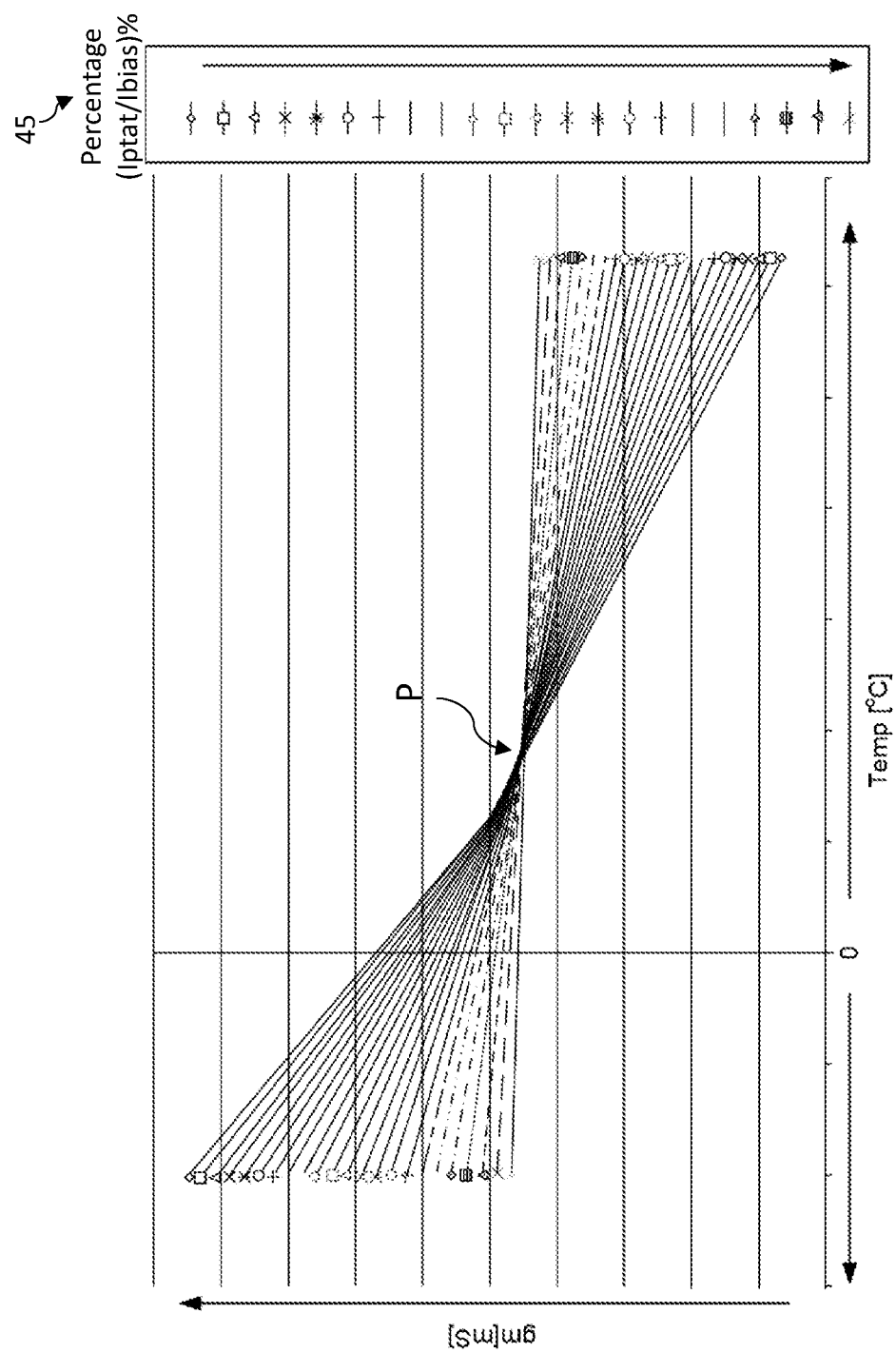
FIG. 3 is a graph illustrating the variation of transconductance versus temperature for a range of possible proportional to absolute temperature (PTAT) current percentages of the bias current.

FIG. 3 is shown to help understand how transconductance ($g_m$) may be made constant with temperature using a bias current that includes a percentage of PTAT currents and a percentage of CT constant currents (e.g., $I_{BIAS}=(m) \cdot I_{PTAT}+ (1−m) \cdot I_{CONST}$). Specifically, FIG. 3 illustrates gm on the y-axis versus temperature on the x-axis for a variety of percentages 45 calculated by Iptat/($I_{BIAS}$) %, where $I_{BIAS}$ is a mathematical combination of $I_{PTAT}$ and $I_{CONST}$. The percentages 45 can vary between approximately 91% and 4% with increasing percentages shown by the arrow in the legend to the right of the graph. As shown, by adjusting the percentage of $I_{PTAT}$ in $I_{BIAS}$, the variation of gm with temperature may be adjusted. Based on this principle, a bias current may be determined for which gm is substantially constant over a range of temperatures (e.g., −40 to 125 degrees Celsius). For reference, the transconductance at point P can be approximately 2.05 milli-seimens (mS) at a temperature of approximately 35° C. For a percentage with a large variation (e.g., approximately 4%), the transconductance can vary between, for example, approximately 1.65 mS (at high temperatures) and approximately 2.55 mS (at low temperatures).

Figure 4A:
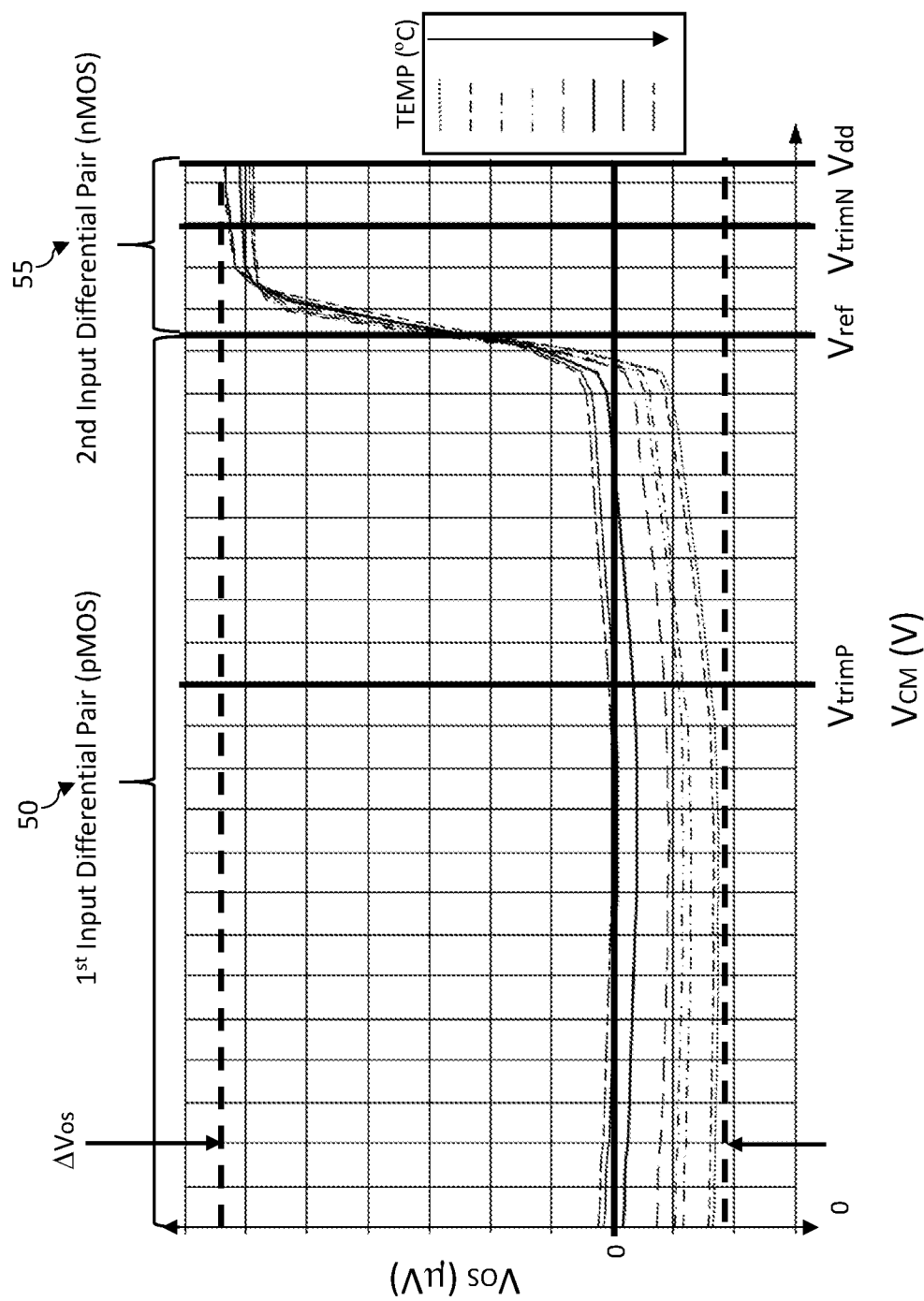
FIG. 4A is a graph illustrating the voltage offset ($V_{OS}$) of the operational amplifier for a range of input voltages ($V_{CM}$) before a trimming process.

FIG. 4A is a graph illustrating the voltage offset ($V_{OS}$) of the operational amplifier in FIG. 2 for a range of input voltages ($V_{CM}$) before trimming. The graph shows offset voltage ($V_{OS}$) (i.e., vertical axis) as a function of input voltages ($V_{CM}$) (i.e., horizontal axis) ranging from zero volts (i.e., $V_{CM}$=0) to a supply voltage (i.e., $V_{CM}$=$V_{dd}$). In a possible implementation, the supply voltage is 5.5V. The $V_{OS}$ shown in FIG. 4A varies. For example, $V_{OS}$ may vary by −180 µV and 650 µV over a $V_{CM}$ range of 0 to 5.5V. The data shows a pronounced change (e.g., $\Delta V_{OS}$=830 µV) in $V_{OS}$ at about the reference voltage ($V_{REF}$), which corresponds to the transition between first input differential pair 50 and the second input differential pair 55. Each of the data lines can be plotted for various temperatures ranging from approximately −50 degrees (deg) Celsius (C) to 150 deg C. (as shown in the legend to the right of the graph with increasing temperature being illustrated by the arrow). The change in $V_{OS}$ between traces at a particular input voltage ($V_{CM}$) is described by the temperature coefficient ($T_C$) at the particular $V_{CM}$.

Figure 4B:
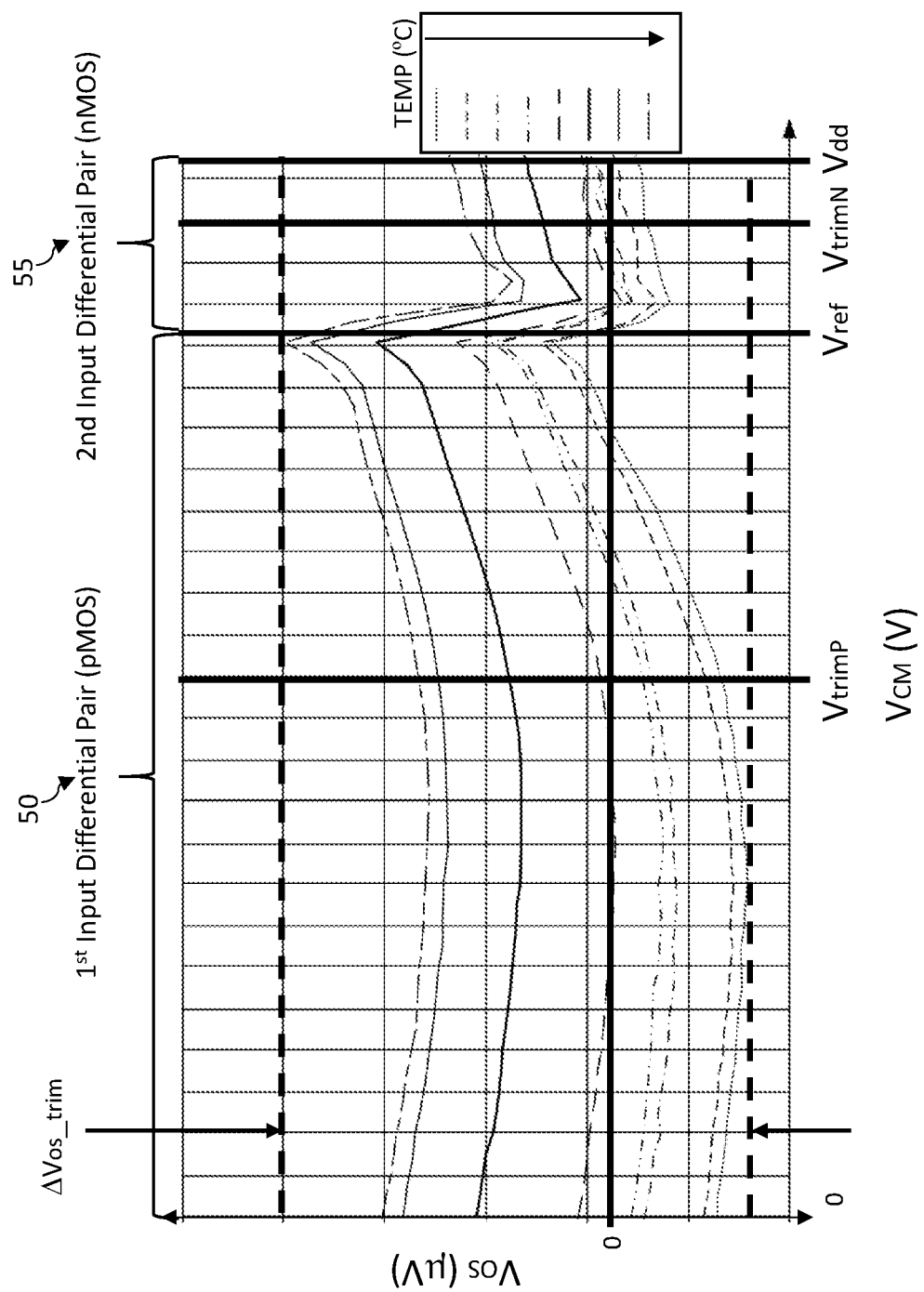
FIG. 4B is a graph illustrating the voltage offset ($V_{OS}$) of the operational amplifier for a range of input voltages ($V_{CM}$) after a trimming process.

FIG. 4B is a graph illustrating the voltage offset ($V_{OS}$) of the operational amplifier in FIG. 2 for a range of input voltages ($V_{CM}$) after trimming. As in the previous figure (see FIG. 4A), the graph shows offset voltage ($V_{OS}$) as a function of input voltages ($V_{CM}$) ranging from zero volts to the supply voltage (e.g., $V_{dd}$=5.5V). In a possible implementation, the $V_{OS}$ shown in FIG. 4B can vary, for example, between approximately −75 µV and 150 µV (i.e., $\Delta V_{OS\_trim}$=225 µV). The data shows that $V_{OS}$ for each input differential pair has been generally reduced (e.g., from approximately 600 µV to less than 50 µV), and the trimming reduces the overall variation (i.e., $\Delta V_{OS}$>$\Delta V_{OS\_trim}$) of $V_{OS}$ over a range (e.g., 0-5.5V) of $V_{CM}$. As before, the data is plotted for various temperatures (e.g., ranging from −50 deg C. to 150 deg C.), as shown in the legend to the right of the graph, which corresponds with the legend in FIG. 4A. The trimming may correct (i.e., reduced towards zero volts, made approximately zero volts, etc.) a $V_{OS}$ at a particular temperature. FIG. 4B illustrates, that after trimming $V_{OS}$ may be closest to zero for most of the range of input voltages ($V_{CM}$) at a particular temperature (e.g., 25 deg C.). The trimming for each input differential pair is performed independently and may result in different and unrelated $I_{TRIM}$ values for each. The arrangement of the different temperature curves is the same before and after trimming, suggesting that $T_C$ is unchanged. This is verified in the following figures.

Figure 5A:
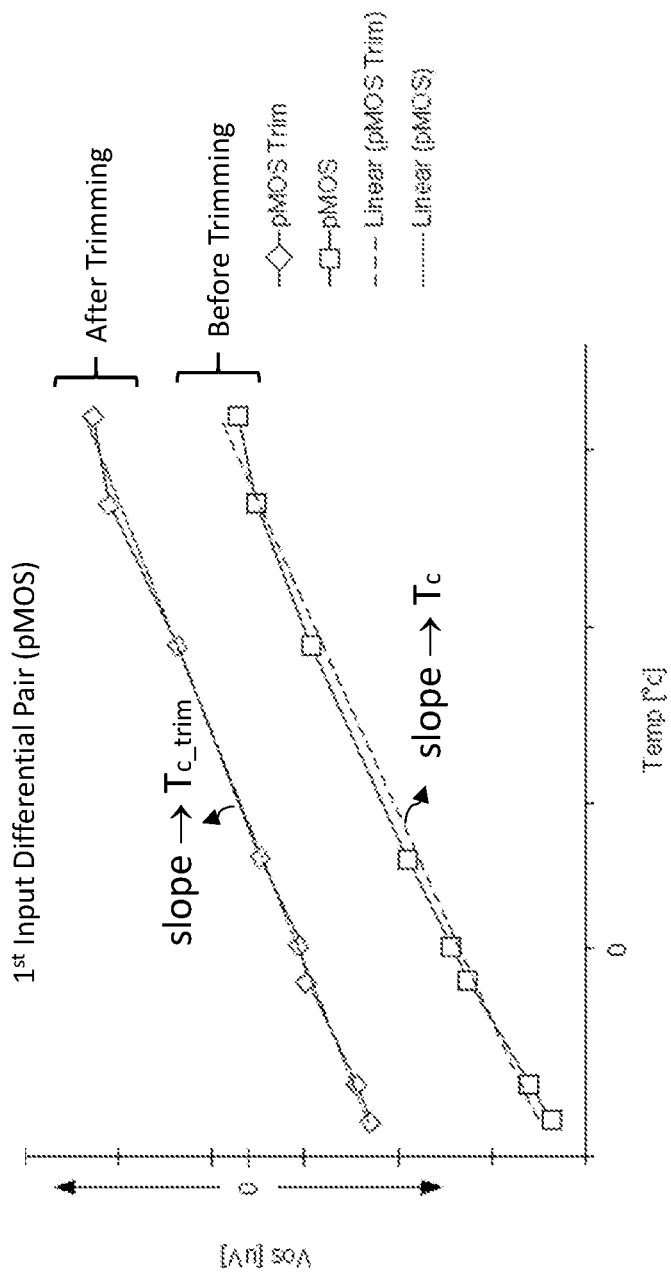
FIG. 5A is a graph illustrating the $V_{OS}$ for a range of temperatures before and after a trimming process at a first input voltage ($V_{CM}=V_{trimP}$).

FIG. 5A, which is based on data from FIGS. 4A and 4B, is a graph illustrating values of the $V_{OS}$ (e.g., −160 µV to 6 µV for pMOS and −65 µV to 84 µV for pMOS Trim) for a range of temperatures (e.g., −50 to 150 deg C.). In some implementations, $V_{DD}$ can be, for example, 5.5V and $V_{CM}$ can be, for example, 2.8V. The graph is for a particular input voltage (i.e., $V_{CM}$=$V_{trimP}$ as shown in FIGS. 4A and 4B)) at which the first differential pair (i.e., the pMOS pair) is trimmed. Two curves are plotted to show the $V_{OS}$ before (i.e., pMOS) and after a trimming (i.e., pMOS trim). At $V_{CM}$=$V_{trimP}$. In some implementations, the $V_{OS}$ can be trimmed from about, for example, −85 µV to about −6 µV at 25 deg C. Additional linear curve fit lines (i.e. Linear (pMOS) and Linear (pMOS) Trim) are plotted. From these it can be observed that the variation (i.e., slope) of $V_{OS}$ versus temperature (i.e., the temperature coefficient) is not significantly changed by the trimming. For example, in some implementations, the $T_C$ before trimming can be about 0.85 while the $T_C$ after trimming can be about 0.77 (i.e., a change that is less than 10%).

Figure 5B:
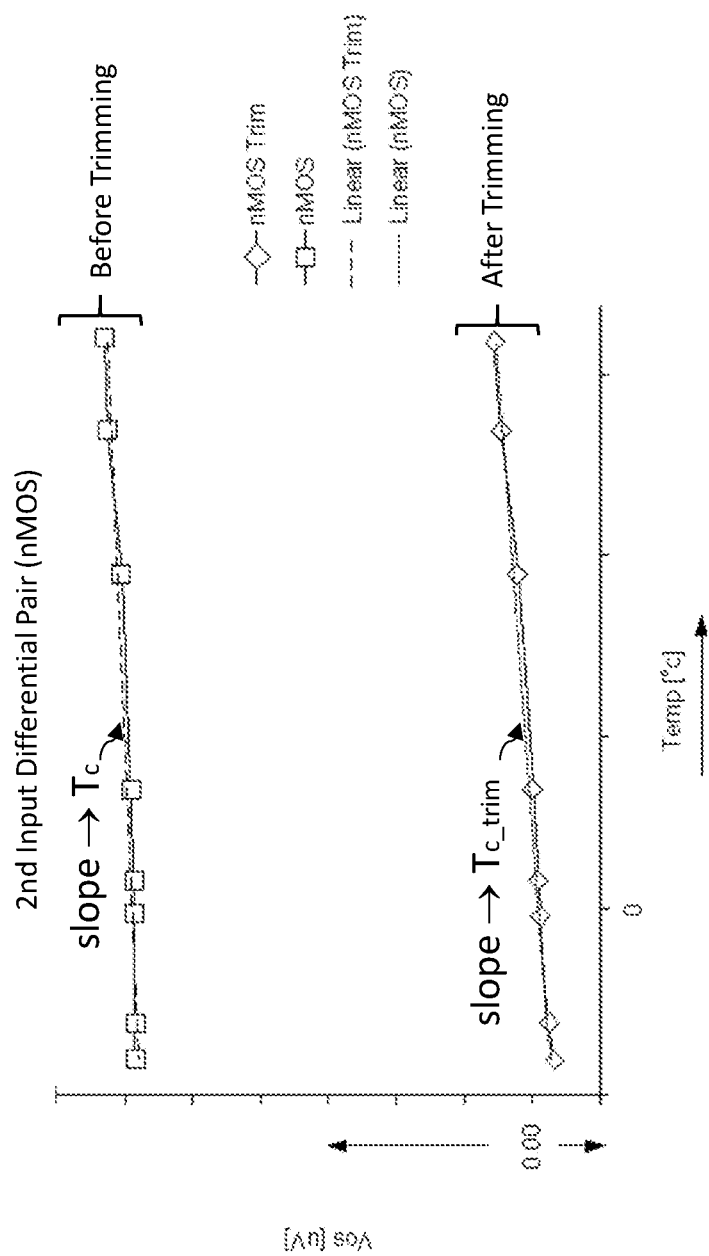
FIG. 5B is a graph illustrating the $V_{OS}$ for a range of temperatures before and after a trimming process at a second input voltage ($V_{CM}=V_{trimN}$).

FIG. 5B, which is based on data from FIGS. 4A and 4B, is a graph illustrating the $V_{OS}$ (e.g., 584 µV to 627 µV for nMOS and −32 µV to 57 µV for nMOS Trim) for a range of temperatures (i.e., −50 to 150 deg C.). In some implementations, Vdd can be, for example, 5.5V and Vcm can be, for example, 4.9V. The graph is for particular input voltage (i.e., $V_{CM}$=$V_{trimN}$ as shown in FIGS. 4A and 4B) at which the second differential pair (i.e., the nMOS pair) is trimmed. Two curves are plotted to show the $V_{OS}$ before (i.e., nMOS) and after (i.e., nMOS Trim) a trimming. In some implementations, at $V_{CM}$=$V_{trimN}$, the $V_{OS}$ can be trimmed from, for example, about 600 µV to about −1.3 µV at 25 deg C. Additional linear curve fit lines (i.e. Linear (nMOS) and Linear (nMOS) Trim) are plotted. From these it can be observed that the variation (i.e., slope) of $V_{OS}$ versus temperature (i.e., the temperature coefficient) is not significantly changed by the trimming. For example, in some implementations, the $T_C$ before trimming can be about 0.24 while the $T_C$ after trimming can be about 0.43.

FIG. 6 schematically depicts details of circuit portions for the input pair and trimming sources activation and for bias control for CT current courses. In particular, the $V_{CM}$ comparator 60, the pMOS input trim sources 65 and constant bias current source (Ict_p) 61, the nMOS input trim sources 70, and the constant bias current source (Ict_n) 71 are shown. The pMOS input trim sources 65 and the nMOS input trim sources 70 are included in a trimming circuit for the operational amplifier. For the embodiment shown, a first input of the $V_{CM}$ comparator is connected to a reference voltage ($V_{REF}$) that is chosen from within a range of possible $V_{CM}$. A second input of the $V_{CM}$ comparator is made with a pair of MOS devices (P6, P7) that are controlled by both inputs of the operational amplifier. The same $V_{CM}$ comparator that controls the bias of the input pairs (i.e., the portion of the bias that is constant with temperature) is used to control the offset voltage correction for each pair. This feature is shown in FIGS. 2 and 6, where a Pcom node is the bias node for the pMOS input pair and an outP− node and an out P+ node are nodes used for offset correction of this pair. It can be observed that both the bias current and the trim currents are controlled by the same input of the $V_{CM}$ comparator (i.e., the input driven by the amplifier's inputs). The pMOS input trim sources 65 operate as a current source that provides a constant trim current for the pMOS complementary 25 pair, as shown in FIG. 2 (i.e., the current source 65 providing Itrim_ct_p). The nMOS input trim sources 70 operate as a current source that provides a constant trim current for the nMOS complementary pair 30, as shown in FIG. 2 (i.e., the current source 70 providing Itrim_ct_n).

FIG. 7 schematically depicts details of circuit portions for bias control for PTAT current sources of the operational amplifier shown in FIG. 2. The circuit portions shown in FIG. 7 uses a $V_{CM}$ comparator 80 of the constant gm bias control circuit 35 to steer the PTAT current. The PTAT current is significantly higher than the constant current generated by the circuit shown in FIG. 6, and it will only be used to bias the input pairs, keeping the gm of the devices constant across temperature. This is necessary in order to trim with a constant voltage across temperature and thus limit the degradation of the temperature coefficient of the offset. With regards to the first input pair 25, the transistors N2 and N5, shown in FIG. 7, can operate as a current sources, each providing half of current, Iptat_p. For example, transistor N2, when configured as shown in FIG. 7, can operate as a current source 81 sinking (Iptat_p)/2 from the first input pair 25. Likewise, transistor N5, when configured as shown in FIG. 7, can operate as a current source 82 sinking (Iptat_p)/2 from the first input pair 25. With regards to the second input pair 30, the transistors P8 and P10, shown in FIG. 7, can operate as current sources, each providing half of current, Iptat_n. For example, transistor P8, when configured as shown in FIG. 7, can operate as a current source 91 sourcing (Iptat_n)/2 to the second input pair 30. Likewise, transistor P10, when configured as shown in FIG. 7, can operate as a current source 92 sourcing (Iptat_n)/2 to the second input pair 30.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation, and all technical and scientific terms used herein have the same meaning as commonly understood by one of ordinary skill in the art.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. An operational amplifier comprising:
   a first differential pair of pMOS transistors, the first differential pair biased by a first bias current that has a first portion that is constant with temperature and a second portion that is proportional to absolute temperature, a ratio of the first and second portions generating a first transconductance of the first differential pair that is substantially constant for temperatures over a range;
   a second differential pair of nMOS transistors, the second differential pair biased by a second bias current that has a first portion that is constant with temperature and a second portion that is proportional to absolute temperature, a ratio of the first and second portions generating a second transconductance of the second differential pair that is substantially constant for temperatures over the range; and
   a comparator that activates either the first differential pair or the second differential pair based on an input voltage at an input.

2. The operational amplifier according to claim 1, wherein the comparator couples the input to the first differential pair when the input voltage is less than a reference voltage, and wherein the comparator couples the input to the second differential pair when the input voltage is greater than the reference voltage.

3. The operational amplifier according to claim 1, further comprising:
   a first trimming circuit that includes a first current source generating a first trim current, the first trimming circuit configurable to trim the first bias current through one of the pMOS transistors in the first differential pair of pMOS transistors to correct a first voltage offset of the first differential pair; and
   a second trimming circuit that includes a second current source generating a second trim current, the second trimming circuit configurable to trim the second bias current through one of the nMOS transistors in the second differential pair of nMOS transistors to correct a second voltage offset of the second differential.

4. The operational amplifier according to claim 3, wherein the first voltage offset and the second voltage offset are adjusted by the first trim current and the second trim current, respectively, to approximately zero volts at approximately 25 degrees Celsius.

5. The operational amplifier according to claim 3, wherein the first trim current is constant with temperature to provide a first voltage offset that has a first temperature coefficient that is substantially the same before and after the trimming; and
   the second trim current is constant with temperature to provide a second voltage offset that has a second temperature coefficient that is substantially the same before and after the trimming.

6. The operational amplifier according to claim 1, wherein:
   the second portion of the first bias current that is proportional to absolute temperature is subtracted from an output of the first differential pair so that only the first portion that is constant with temperature is transmitted to subsequent stages in the operational amplifier; and
   the second portion of the second bias current that is proportional to absolute temperature is subtracted from an output of the second differential pair so that only the first portion that is constant with temperature is transmitted to subsequent stages in the operational amplifier.

7. The operational amplifier according to claim 1, wherein:
the first differential pair of pMOS transistors are operated in a subthreshold region; and
the second differential pair of nMOS transistors are operated in a subthreshold region.

8. A method for reducing an offset voltage in an operational amplifier, the method comprising:
applying a first bias current to a first differential pair of transistors, the first bias current including a first portion that is constant with temperature and a second portion that is proportional to absolute temperature, a ratio of the first and second portions selected so that a first transconductance of the first differential pair is substantially constant for temperatures over a range;
generating a first trim current to trim the first bias current through one of the transistors in the first differential pair to reduce a first voltage offset of the first differential pair of transistors towards zero volts;
applying a second bias current to a second differential pair of transistors, the second bias current including a first portion that is constant with temperature and a second portion that is proportional to absolute temperature, the ratio of the first and second portions selected so that a second transconductance of the second differential pair is substantially constant for temperatures over a range; and
generating a second trim current to trim the second bias current through one of the transistors in the second differential pair of transistors to reduce a second voltage offset of the second differential pair of transistors towards zero volts.

9. The method for reducing an offset voltage in an operational amplifier according to claim 8, wherein
the first differential pair of transistors includes pMOS transistors; and
the second differential pair of transistors includes nMOS transistors.

10. The method for reducing an offset voltage in an operational amplifier according to claim 8, further comprising:
activating, based on an input voltage at an input, either the first differential pair of transistors or the second differential pair of transistors; and
coupling the input to the activated differential pair of transistors.

11. The method for reducing an offset voltage in an operational amplifier according to claim 8, wherein:
the first voltage offset has a first temperature coefficient that is substantially unaffected by the trimming of the first bias current; and
the second voltage offset has a second temperature coefficient that is substantially unaffected by the trimming of the second bias current.

12. The method for reducing an offset voltage in an operational amplifier according to claim 8, further comprising:
subtracting, from an output of the first differential pair, the second portion of the first bias current that is proportional to absolute temperature so that only the first portion that is constant with temperature is transmitted to subsequent stages in the operational amplifier; and
subtracting, from an output of the second differential pair, the second portion of the second bias current that is proportional to absolute temperature so that only the first portion that is constant with temperature is transmitted to subsequent stages in the operational amplifier.

13. The method for reducing an offset voltage in an operational amplifier according to claim 8, further comprising:
operating the first differential pair transistors in a subthreshold region; and
operating the second differential pair transistors in a subthreshold region.

14. A rail-to-rail operational amplifier comprising:
a first differential pair of p-type transistors configured to be biased by a first bias current, the first bias current having a first portion that is constant with temperature and a second portion that is proportional to absolute temperature, an amount of the second portion selected so that a first transconductance of the first differential pair is substantially constant over a range of temperature;
a first trimming circuit that is coupled to the first differential pair of p-type transistors and that is configured to trim the first bias current through one of the p-type transistors in the pair of p-type transistors to adjust a first offset voltage towards zero volts;
a second differential pair of n-type transistors configured to be biased by a second bias current, the second bias current having a first portion that is constant with temperature and a second portion that is proportional to absolute temperature, an amount of the second portion selected so that a second transconductance of the second differential pair is substantially constant over a range of temperature; and
a second trimming circuit that is coupled to the second differential pair of n-type transistors and that is configured to trim the second bias current through one of the n-type transistors in the pair of n-type transistors to adjust a second offset voltage towards zero volts.

15. The rail-to-rail operational amplifier according to claim 14, further comprising a bias control circuit that includes comparators configured to control (i) the first bias current to activate the first differential pair or (ii) the second bias current to activate the second different pair, the control based on a comparison of an input common mode voltage to a threshold voltage.

16. The rail-to-rail operational amplifier according to claim 15, wherein:
the first trimming circuit is configured to adjust the first offset voltage using a first trim current that is constant over temperature so that a first temperature coefficient of the first voltage offset is unaffected by the trimming; and
the second trimming circuit is configured to adjust the second offset voltage using a second trim current that is constant over temperature so that a second temperature coefficient of the second voltage offset is unaffected by the trimming.

17. The rail-to-rail operational amplifier according to claim 16, wherein:
the first trimming circuit is activated simultaneously with the first differential pair by the bias control circuit; and
the second trimming circuit is activated simultaneously with the second differential pair by the bias control circuit.

18. The rail-to-rail operational amplifier according to claim 16, wherein the first offset voltage and the second offset voltage are approximately the same after trimming.

19. The rail-to-rail operational amplifier according to claim 14, wherein:

the p-type transistors are pMOS transistors operated in a subthreshold region; and the n-type transistors are nMOS transistors operated in a subthreshold region.

* * * * *